(12) United States Patent
Shibahara

(10) Patent No.: US 10,281,779 B2
(45) Date of Patent: *May 7, 2019

(54) DISPLAY UNIT HAVING A CURVED DISPLAY PANEL

(71) Applicant: Saturn Licensing LLC, New York, NY (US)

(72) Inventor: Seiji Shibahara, Chiba (JP)

(73) Assignee: Saturn Licensing LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/399,306

(22) Filed: Jan. 5, 2017

(65) Prior Publication Data

US 2017/0192285 A1 Jul. 6, 2017

Related U.S. Application Data

(63) Continuation of application No. 14/410,375, filed as application No. PCT/JP2013/066303 on Jun. 13, 2013, now Pat. No. 9,568,788.

(30) Foreign Application Priority Data

Jun. 29, 2012 (JP) .................................. 2012-147761

(51) Int. Cl.
*G02F 1/1333* (2006.01)
*G02F 1/1345* (2006.01)
*H01L 27/32* (2006.01)

(52) U.S. Cl.
CPC ........ *G02F 1/13452* (2013.01); *G02F 1/1333* (2013.01); *G02F 1/133382* (2013.01);
(Continued)

(58) Field of Classification Search
CPC ......... G02F 1/133308; G02F 1/133305; G02F 1/133608; G02F 2001/133314;
(Continued)

(56) References Cited

U.S. PATENT DOCUMENTS 5,273,475 A * 12/1993 Oshikawa ......... G02F 1/133305
156/163
5,781,264 A 7/1998 Noda et al.
(Continued)

FOREIGN PATENT DOCUMENTS

CN 101208732 A 6/2008
JP 08-327987 6/1995
(Continued)

OTHER PUBLICATIONS

International Search Report based on PCT/JP2013/066303, dated Sep. 17, 2013, 2 pgs.
(Continued)

*Primary Examiner* — Huyen L Ngo
(74) *Attorney, Agent, or Firm* — Lerner, David, Littenberg, Krumholz & Mentlik, LLP

(57) ABSTRACT

A display unit having a curved display panel. In an illustrative configuration, the display unit includes a curved control circuit board, wherein the display panel is connected to the control circuit board by a wiring section and the control circuit board is curved so as to eliminate or reduce non-uniform deflection in the wiring section.

17 Claims, 13 Drawing Sheets

(52) U.S. Cl.
CPC .... *G02F 1/133305* (2013.01); *H01L 27/3276* (2013.01); *H01L 2251/5338* (2013.01)

(58) Field of Classification Search
CPC .......... G02F 2001/133317; G02F 2001/13332; F21K 9/232; F21V 15/01; F21V 21/00; F21V 23/001; H01L 51/0097; H04N 9/312; H05K 1/181
See application file for complete search history.

(56) References Cited

U.S. PATENT DOCUMENTS

| | | | |
|---|---|---|---|
| 5,897,188 A * | 4/1999 | Sasuga | G02F 1/133308 349/149 |
| 6,636,281 B1 | 10/2003 | Kanatsu | |
| 7,746,439 B2 | 6/2010 | Kohno | |
| 8,212,970 B2 | 7/2012 | Nagata | |
| 8,310,614 B2 * | 11/2012 | Sasaki | G02F 1/1333 349/158 |
| 8,958,026 B2 | 2/2015 | Park et al. | |
| 9,213,195 B2 * | 12/2015 | Watanabe | G02F 1/1333 |
| 9,568,788 B2 | 2/2017 | Shibahara | |
| 2002/0174998 A1 | 11/2002 | Takaoka | |
| 2003/0020152 A1 | 1/2003 | Inoue et al. | |
| 2004/0016568 A1 | 1/2004 | Palanisamy | |
| 2005/0184664 A1 * | 8/2005 | Kang | H05K 5/02 313/583 |
| 2006/0038501 A1 * | 2/2006 | Koyama | G09G 3/3216 315/169.3 |
| 2006/0198089 A1 | 9/2006 | Cho | |
| 2006/0202618 A1 | 9/2006 | Ishii et al. | |
| 2008/0088768 A1 | 4/2008 | Kohno | |
| 2009/0135095 A1 | 5/2009 | Kawada | |

FOREIGN PATENT DOCUMENTS

| | | | |
|---|---|---|---|
| JP | 2001-083897 A | | 3/2001 |
| JP | 2002-351346 A | | 12/2002 |
| JP | 2003-115568 A | | 4/2003 |
| JP | 2003295164 A | | 10/2003 |
| JP | 2003-337541 A | | 11/2003 |
| JP | 2006-243705 A | | 9/2006 |
| JP | 2007-078670 A | | 3/2007 |
| JP | 2008-096866 A | | 4/2008 |
| JP | 2008-112070 A | | 5/2008 |
| JP | 2009-133920 A | | 6/2009 |
| JP | 2010-008479 A | | 1/2010 |
| JP | 2010008479 A | * | 1/2010 |
| JP | 2013-134295 A | | 7/2013 |
| WO | 2007/020697 A1 | | 2/2007 |

OTHER PUBLICATIONS

Extended European Search Report for EP Application No. 13809363.8, dated Jan. 27, 2016.
Japanese Office Action for Appln. No. for JP2014522535 dated May 22, 2017.
Russian Office Action for Application No. 2014152110, dated Jun. 2, 2017.

* cited by examiner

[FIG. 1]
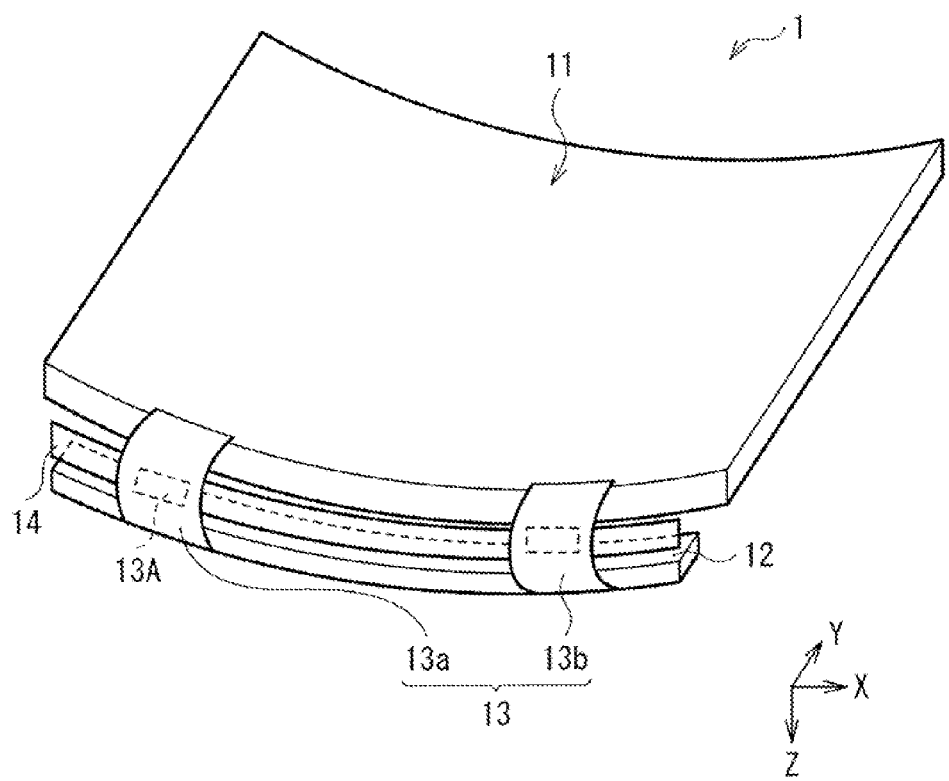

[FIG. 2A]
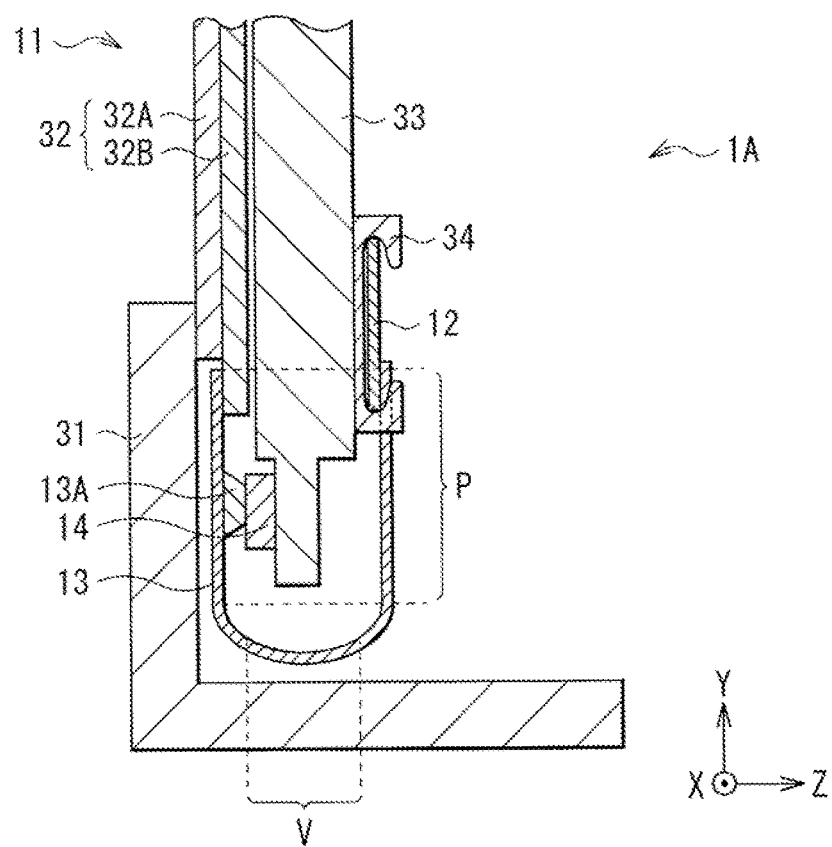

[ FIG. 2B ]
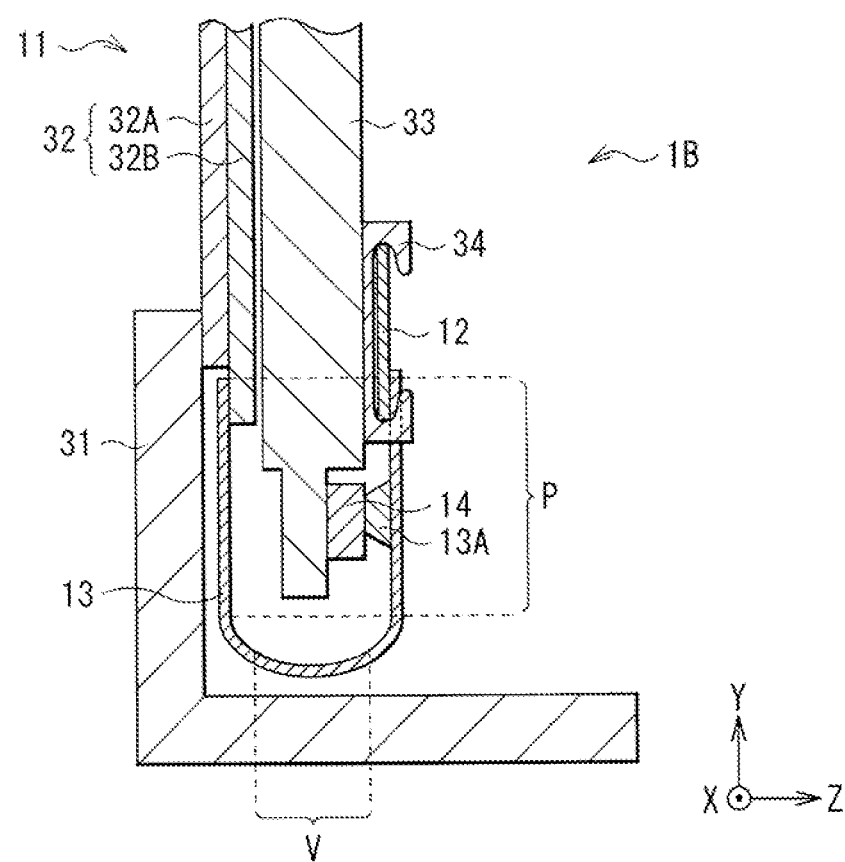

[FIG. 2C]
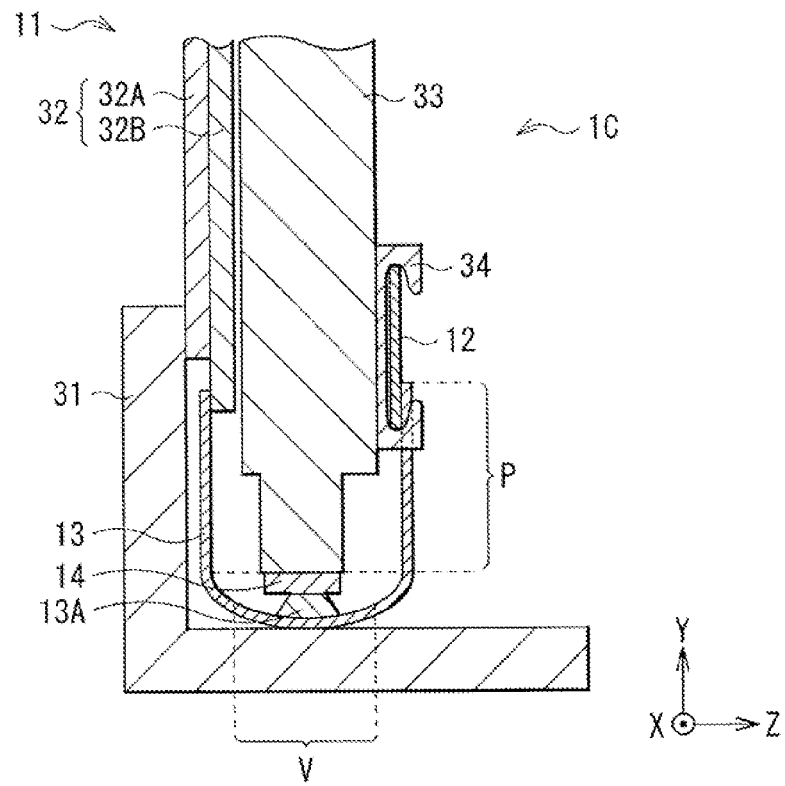
[FIG. 3]
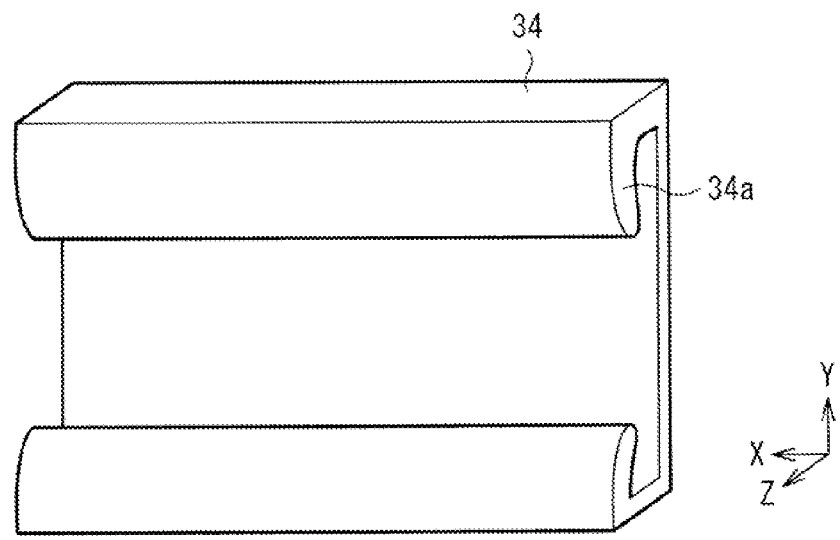

[ FIG. 4 ]
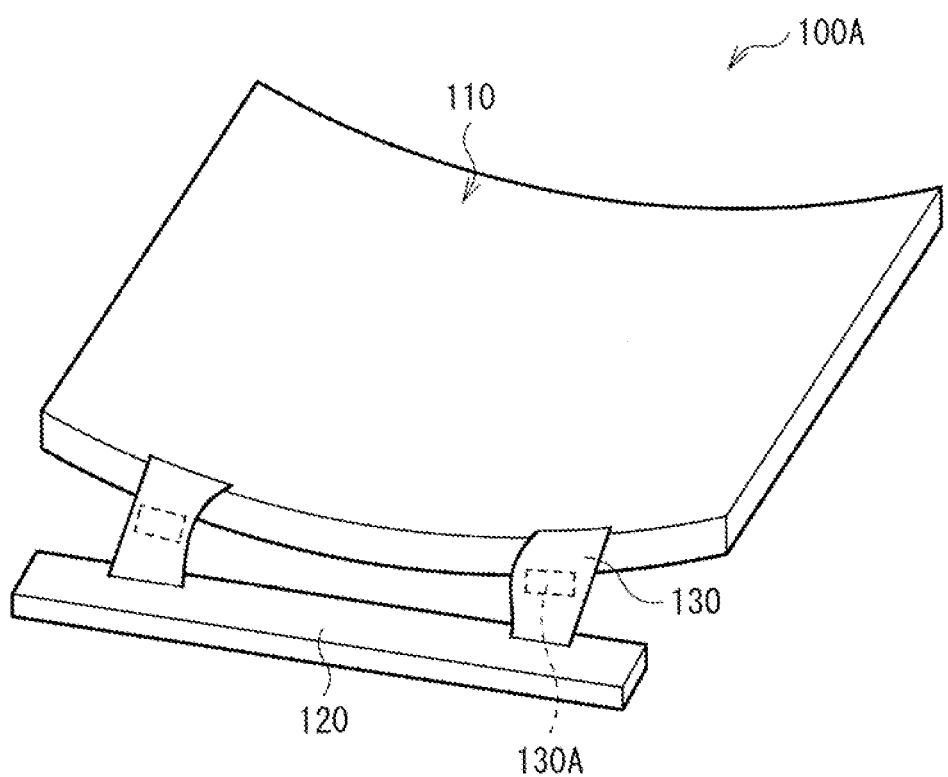

[FIG. 5]
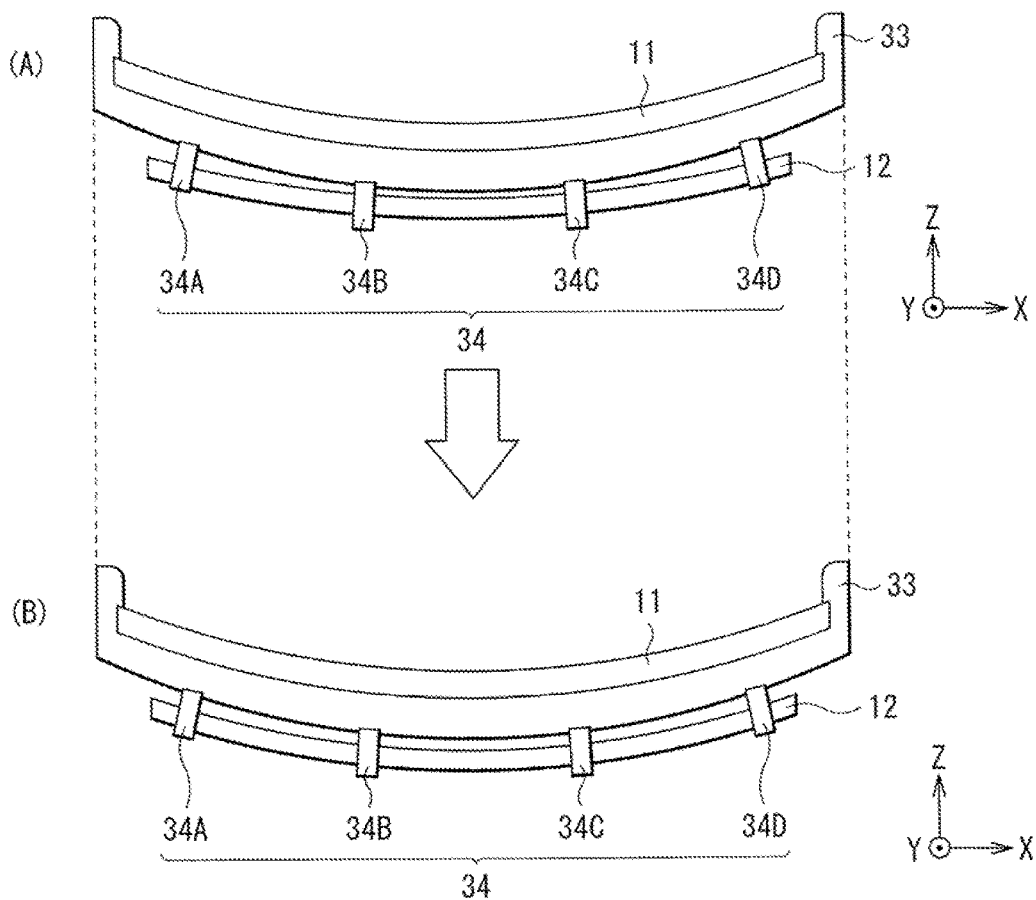

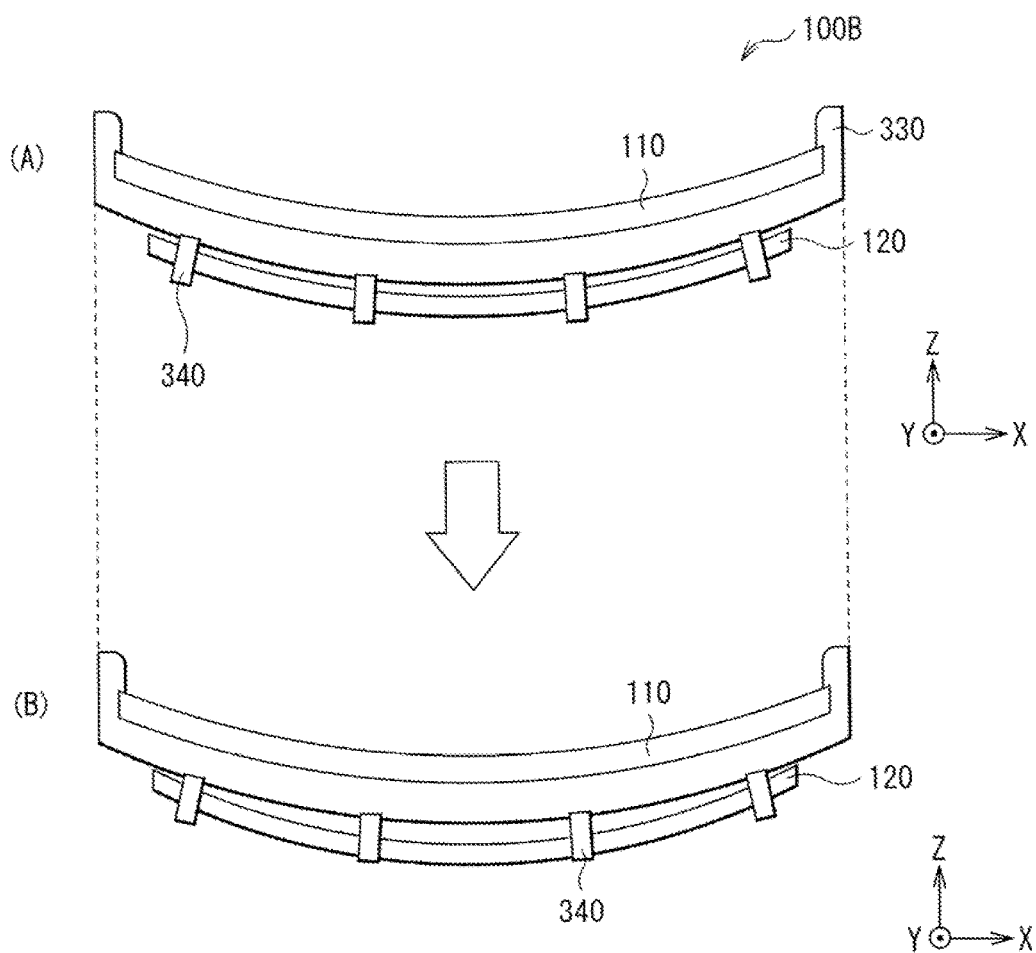

[FIG. 7A]
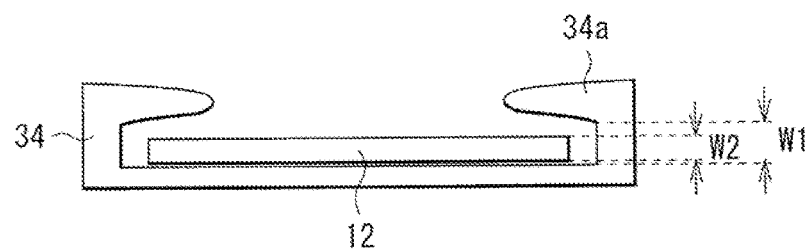
[FIG. 7B]
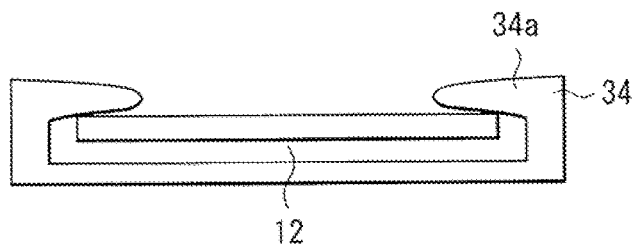
[FIG. 8]
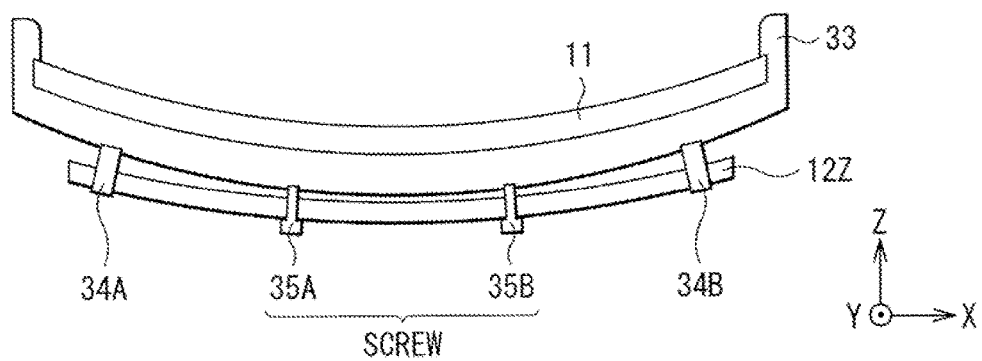

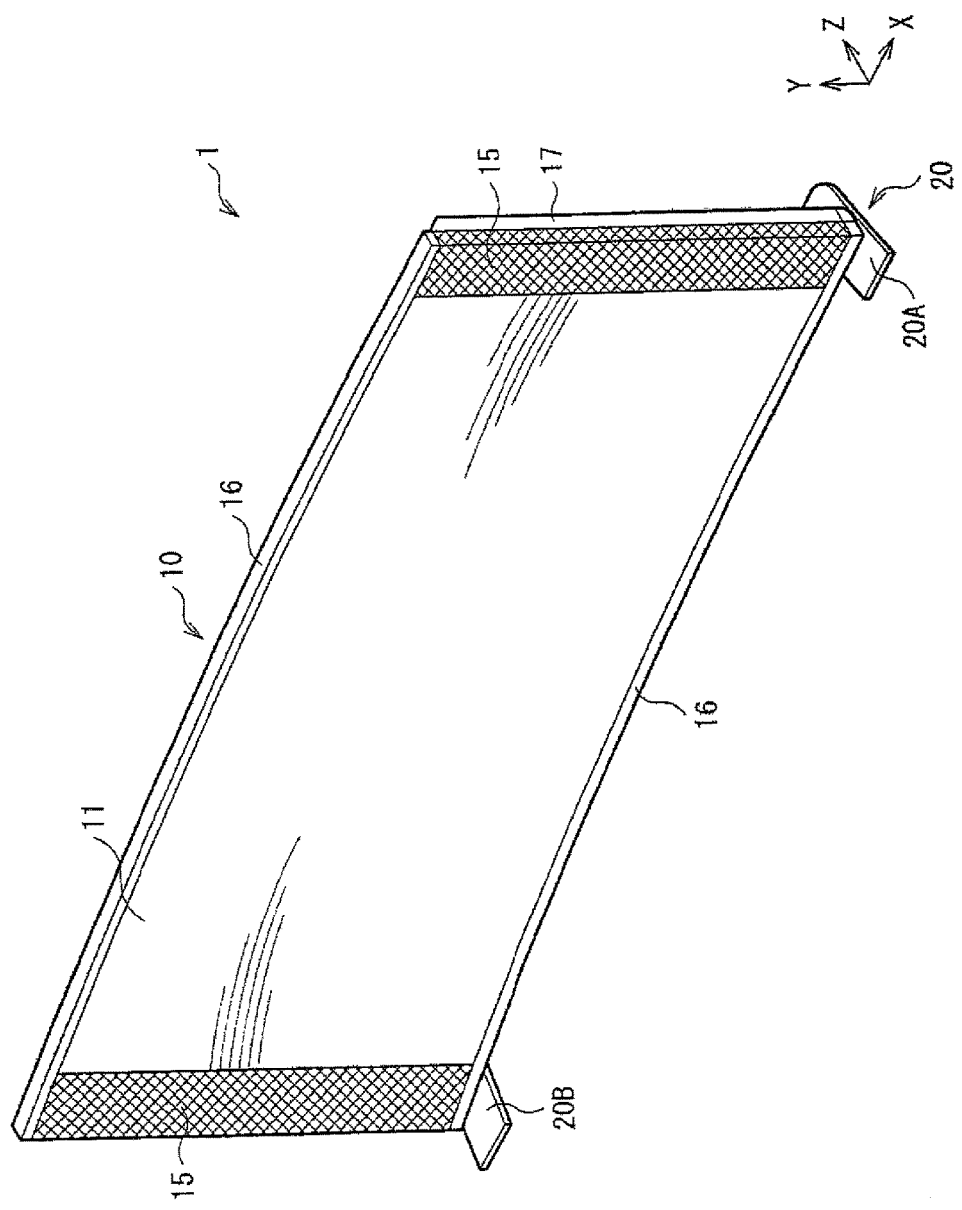
[ FIG. 9 ]

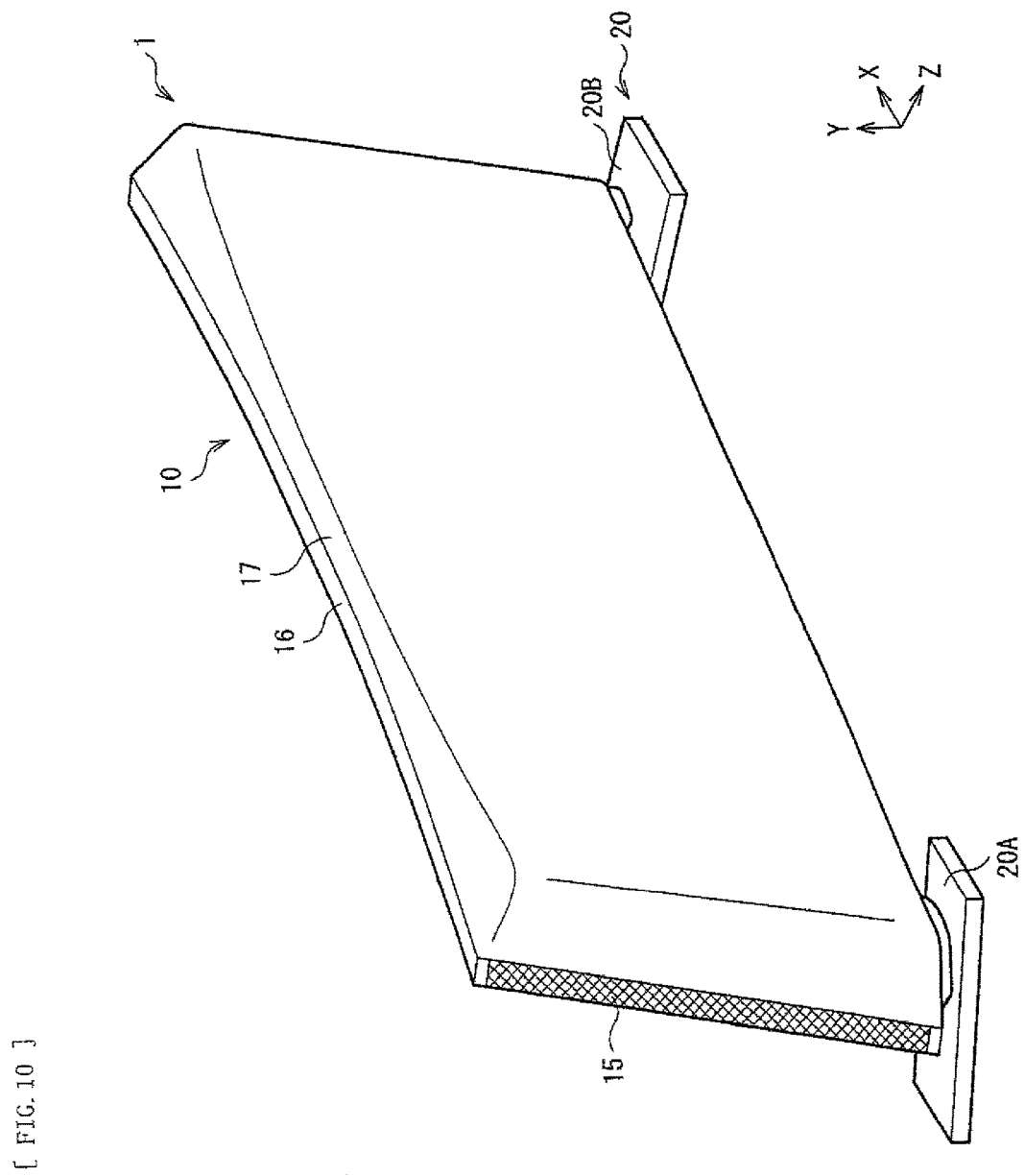
[ FIG. 10 ]

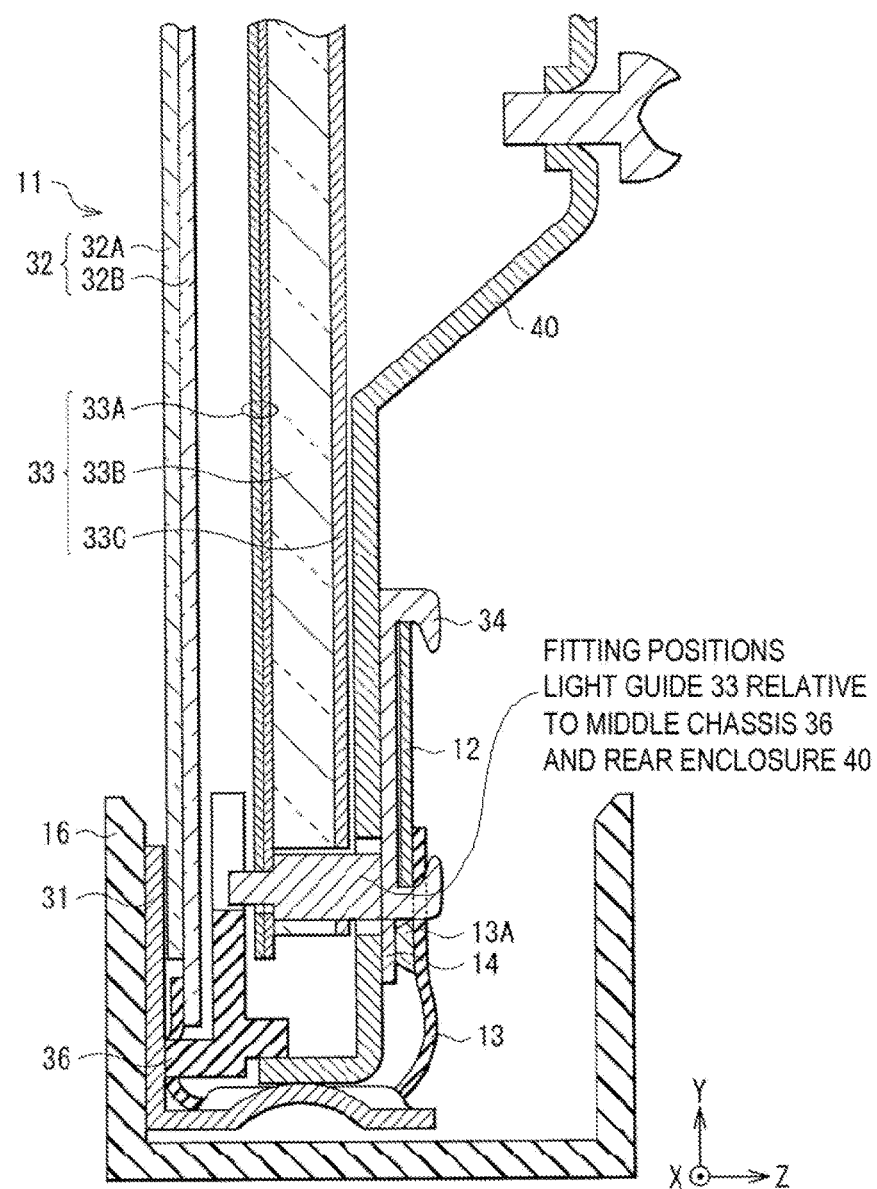
[FIG. 11]

[ FIG. 12 ]
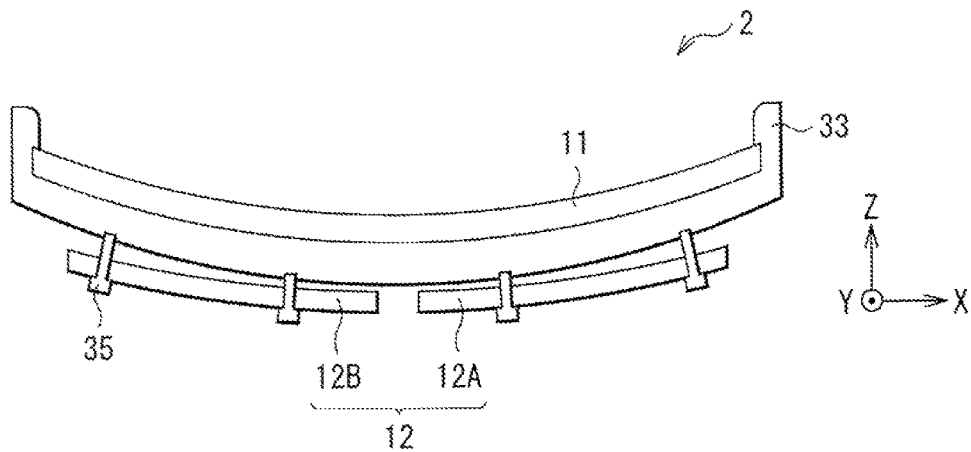
[ FIG. 13 ]
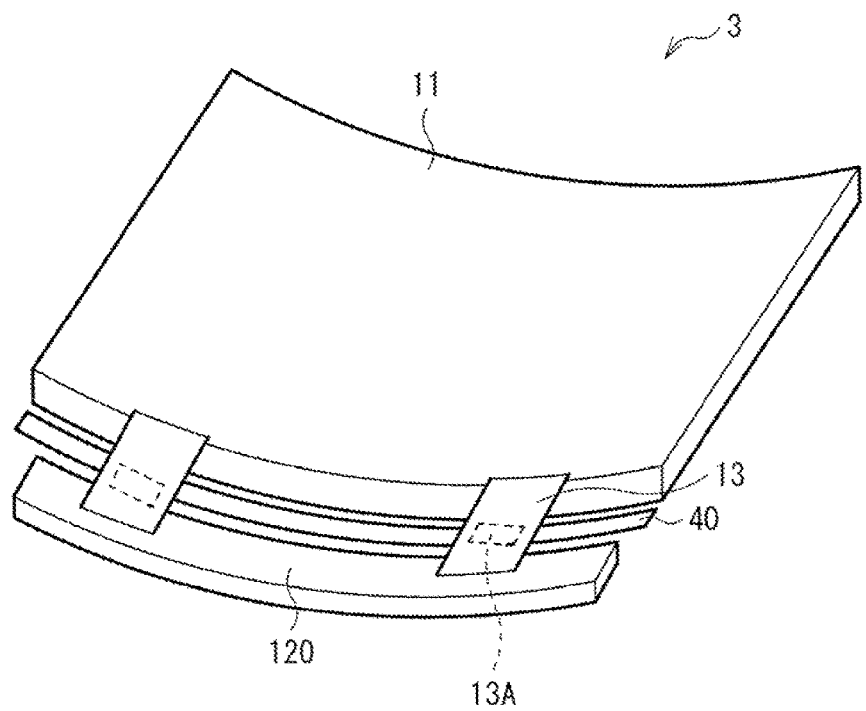

[ FIG. 14 ]
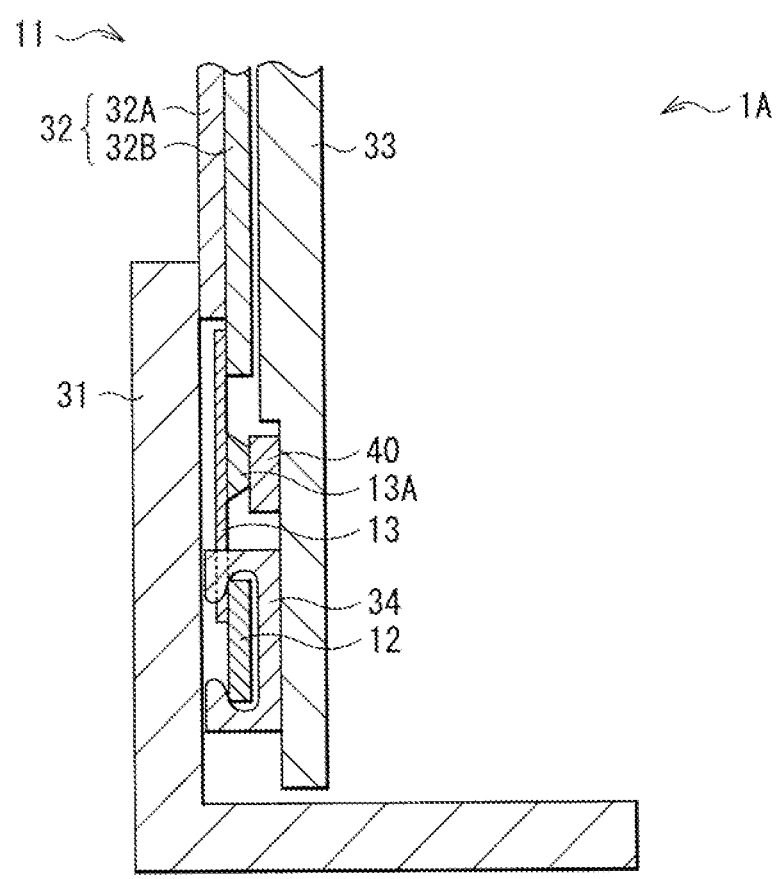

DISPLAY UNIT HAVING A CURVED DISPLAY PANEL

CROSS-REFERENCES TO RELATED APPLICATIONS

The present application is a continuation of U.S. application Ser. No. 14/410,375 filed Dec. 22, 2014, which application is a national phase entry under 35 U.S.C. § 371 of International Application No. PCT/JP2013/066303 filed Jun. 13, 2013, published on Jan. 3, 2014 as WO 2014/002779 A1, which claims priority from Japanese Patent Application No. JP 2012-147761 filed in the Japanese Patent Office on Jun. 29, 2012.

TECHNICAL FIELD

The present disclosure relates to a display unit suitable for a large-screen television or the like.

BACKGROUND ART

As flat panel type display units, liquid crystal display units, plasma display units, electroluminescence units, and the like are known, and the liquid crystal display units have spread widely as a representative of the flat panel type display units. In recent years, these flat panel type display units have been growing in size, and demand for displaying on a curved surface has been growing in terms of a sense of spread and designability.

In a case where the above-described flat panel type display unit performs display on a curved surface, i.e., in a case where a display panel is curved and deformed in an arc shape, the following issue arises. For example, with respect to the display panel that is curved and deformed in an arc shape, a control circuit board provided with a drive circuit configured to control driving of the display panel has a flat-plate shape. Therefore, nonuniform deflection occurs in a printed circuit board with flexibility (a flexible printed circuit board) connecting the display panel and the control circuit board to each other. This deflection causes stress on the flexible printed circuit board, and display quality is deteriorated by a long period of use.

On the other hand, for example, in a display unit described in PTL 1, there is disclosed a method of reducing stress by providing a slit having a small circular hole to a flexible printed circuit board, and appropriately adjusting a slit width of the slit.

CITATION LIST

Patent Literature

PTL 1: Japanese Unexamined Patent Application Publication No. 2008-96866

SUMMARY OF INVENTION

However, such a flexible printed circuit board with a small circular hole has issues of low versatility and high cost.

Therefore, it is desirable to provide a display unit capable of reducing deterioration in display quality with time by a simple method.

A display unit of an embodiment of the present disclosure includes: a first plate-like member including a display device; a second plate-like member including a drive circuit, the drive circuit configured to control the display device; and one or two or more wiring sections having flexibility, the wiring sections configured to connect the first plate-like member and the second plate-like member to each other, in which a curvature of the second plate-like member is larger than 0 and equal to or smaller than a curvature of the first plate-like member.

In the display unit of the embodiment of the present disclosure, the curvature of the second plate-like member of the first plate-like member and the second plate-like member connected to each other by the wiring section having flexibility is larger than 0 and equal to or smaller than the curvature of the first plate-like member. Therefore, nonuniform deflection in the wiring section is reduced, and generation of stress on the wiring section is allowed to be suppressed.

According to the display unit of the embodiment of the present disclosure, the curvature of the second plate-like member is larger than 0 and equal to or smaller than that of the first plate-like member; therefore, nonuniform deflection in the wiring section connecting the first plate-like member and the second plate-like member to each other is reduced. Accordingly, generation of stress on the wiring section is suppressed, and deterioration in display quality with time is allowed to be reduced.

BRIEF DESCRIPTION OF DIAGRAMS

FIG. 1 is a perspective view illustrating an example of a configuration of a main part of a display unit according to a first embodiment of the present disclosure.

FIG. 2A is a sectional view illustrating an example of the display unit illustrated in FIG. 1.

FIG. 2B is a sectional view illustrating another example of the display unit illustrated in FIG. 1.

FIG. 2C is a sectional view illustrating another example of the display unit illustrated in FIG. 1.

FIG. 3 is a perspective view describing a shape of a holding section illustrated in FIG. 2A.

FIG. 4 is a perspective view illustrating a configuration of a main part of a display unit according to a comparative example.

FIG. 5 is a sectional view illustrating a shape of the main part of the display unit illustrated in FIG. 1 before driving (A) and during driving (B).

FIG. 6 is a sectional view illustrating a shape of a main part of the display unit according to the comparative example before driving (A) and during driving (B).

FIG. 7A is a schematic view illustrating an example of a positional relationship between a second plate-like member and a holding section.

FIG. 7B is a schematic view illustrating another example of the positional relationship between the second plate-like member and the holding section.

FIG. 8 is a schematic view illustrating another example of holding of the second plate-like member.

FIG. 9 is a perspective view illustrating an example of an appearance viewed from a front surface side of the display unit illustrated in FIG. 1.

FIG. 10 is a perspective view illustrating an example of an appearance viewed from a back surface side of the display unit illustrated in FIG. 1.

FIG. 11 is a sectional view illustrating an internal configuration of a central portion of the display unit illustrated in FIGS. 9 and 10.

FIG. 12 is a schematic view illustrating an example of a configuration of a main part of a display unit according to Modification Example 1.

FIG. 13 is a sectional view illustrating a configuration of a main part of a display unit according to Modification Example 2.

FIG. 14 is a sectional view of the display unit illustrated in FIG. 13.

DESCRIPTION OF EMBODIMENTS

Some embodiments of the present disclosure will be described in detail below referring to the accompanying drawings. It is to be noted that description will be given in the following order.
1. Embodiment (Example of display unit in which a control circuit board has curvature)
   1-1. Configuration of Main Part
   1-2. Change in Shape of Display Unit before Driving and during Driving
   1-3. Entire Configuration
2. Modification Example 1 (Example in which a control circuit board is partitioned)
3. Modification Example 2 (Example in which a liquid crystal panel and a control circuit board are arranged nearly on a plane)

1. Embodiment (1-1. Configuration of Main Part)

FIG. 1 illustrates an example of a configuration of a main part of a display unit (a display unit 1) according to an embodiment of the present disclosure. The display unit 1 may include, for example, a liquid crystal panel 11 (corresponding to a first plate-like member) as a display body. The liquid crystal panel 11 is curved in an arc shape in a one-dimensional direction (an X direction in this case), and is connected to a control circuit board 12 (corresponding to a second plate-like member) through, for example, a COF (Chip On Film) 13 (corresponding to a wiring section) having flexibility. As will be described in detail later, the control circuit board 12 is curved in an arc shape on a one-dimensional direction (the X direction) in a similar manner to the liquid crystal panel 11, and a curvature of the control circuit board 12 may be preferably larger than 0 and equal to or smaller than a curvature of the liquid crystal panel 11.

The display unit 1 may be used as, for example, a television, and has a configuration in which a flat plate-like main body section 10 for image display is supported by stands 20A and 20B (hereinafter collectively referred to as "stands 20"). It is to be noted that the display unit 1 in a state in which the stands 20 are attached to the main body section 10 is placed on a horizontal surface such as a floor, a shelf, or a table to be used as a stationary type; however, the display unit 1 in a state in which the stands 20 are removed from the main body section 10 may be used as a wall-hanging type (refer to FIG. 5 in both cases). In this description, a front-back direction of the main body section 10 refers to a Z direction, and a right-left direction and a top-bottom direction in a main surface (a widest surface) of the main body section 10 refer to the X direction and a Y direction, respectively.

FIG. 2 illustrates a sectional configuration of a main part of the display unit 1 illustrated in FIG. 1 together with other components.

A front enclosure 31 is a frame-shaped metal component with which a front peripheral portion of the liquid crystal panel 11 is covered.

The liquid crystal panel 11 is configured to display an image such as a moving image or a still image, and may be configured of, for example, a liquid crystal cell 32 in which a liquid crystal layer (not illustrated; corresponding to a display device) is sealed between two substrates of glass or the like (a CF substrate 32A and a TFT substrate 32B). It is to be noted that, although not illustrated, polarizing plates (not illustrated) allowing polarized light in a specific direction to pass therethrough are provided to respective surfaces (a front surface (a display surface) and a back surface) on a side opposite to a side facing the liquid crystal layer of the CF substrate 32A and the TFT substrate 32B.

As described above, the liquid crystal panel 11 in this embodiment is curved in an arc shape in the one-dimensional direction (the X direction). More specifically, the liquid crystal panel 11 may be desirably curved in a convex shape rearward (toward a back surface side, toward the Z direction) with respect to the display surface. By doing so, in a shape viewed from the front surface of the liquid crystal panel 11, a central portion is thinned more gradually than right and left portions; therefore, a sense of unity and a sense of immersion are allowed to be produced by visual effects of perspective.

Moreover, the curved shape of the liquid crystal panel 11 may be preferably uniform in the Y direction. This is because, in a case where the curvature varies in the Y direction, a twist may be locally applied to the liquid crystal panel 11, thereby causing damage to the liquid crystal panel 11 or a display defect.

As described above, the control circuit board 12 is curved in an arc shape in the one-dimensional direction (the X direction) in a similar manner to the liquid crystal panel 11. For example, TFT (Thin Film Transistor) devices for control of driving of a plurality of pixel electrodes (not illustrated) provided to the above-described TFT substrate 32B, and a gate line, a source line, and the like (all not illustrated) connected to these TFT devices may be provided to the control circuit board 12. In addition, the control circuit board 12 includes a timing controller substrate, a balancer substrate configured to control a backlight light source, and the like.

It is to be noted that, as illustrated in FIG. 2A, the control circuit board 12 is connected to an electrode terminal section (not illustrated) for external connection provided to the liquid crystal panel 11 by the COF 13 that will be described later. In this embodiment, as will be described in detail later, the control circuit board 12 is curved in a similar manner to the liquid crystal panel 11, and the COF 13 is bent to dispose, by a holding section 34, the control circuit board 12 on a back surface side of the liquid crystal panel 11, more specifically, on, for example, a back surface of a supporting member 33 that will be described later. It is to be noted that a curve direction of the control circuit board 12 is the same as that (the X direction) of the liquid crystal panel 11 in a state in which the COF 13 is bent.

The COF 13 is configured to connect the liquid crystal panel 11 and the control circuit board 12 to each other at one spot or two or more spots, and in this case, at two spots (COFs 13a and 13b). The COF 13 may be configured by forming, for example, a large number of striped electrodes made of copper as wiring on, for example, an insulating base film such as a polyimide film. Moreover, in addition to the wiring, an IC chip 13A may be provided on the COF 13.

It is to be noted that the position of the IC chip 13A on the COF 13 is not specifically limited. For example, as illustrated in FIGS. 2A to 2C, the COF 13 is so bent as to form two parallel sections P with respect to the liquid crystal panel 11 and a vertical section V connecting these parallel sections P to each other. In this state, the IC chip 13A may be arranged on the parallel section P, i.e., a substantially same plane (on a front surface side of the supporting member 33) as the liquid crystal panel 11 as illustrated in FIG. 2A, or a substantially same plane (a back surface side of the supporting member 33) as the control circuit board 12 as illustrated in FIG. 2B. Alternatively, as illustrated in FIG. 2C, the IC chip 13A may be arranged on the vertical section V, i.e., substantially perpendicular to the liquid crystal panel 11 and the control circuit board 12, and more specifically, the IC chip 13A may be so arranged as to allow the IC chip 13A and a portion around the IC chip 13A of the COF 13 to be in contact with the front enclosure 31. The IC chip 13A and the portion around the IC chip 13A of the COF 13 are allowed to be stably in contact with the front enclosure 31 by arranging the IC chip 13A in such a manner.

The IC chip 13A operates to receive a gate signal, a source signal, or the like transmitted from the control circuit board 12 and transmit the gate signal, the source signal, and the like to the liquid crystal panel 11 by control. It is to be noted that, as a method of electrically connecting them to one another, a method of connecting them to one another through an ACF (anisotropic conductive film) is used. Moreover, a heat dissipation sheet 14 is provided on the IC chip 13A, and, for example, as illustrated in FIG. 1, the heat dissipation sheet 14 may be so provided as to connect the IC chips 13A provided to respective COFs 13a and 13b to each other. It is to be noted that the heat dissipation sheet 14 is not indispensable, and may be omitted as necessary. In particular, as illustrated in FIG. 2C, in a case where the IC chip 13A and the portion around the IC chip 13A of the COF 13 are in contact with the front enclosure 31, heat is dissipated through the front enclosure 31; therefore, it is not specifically necessary to provide the heat dissipation sheet 14.

The supporting member 33 may be, for example, an optical sheet 33A, a light guide plate 33B, a reflector 33C, and the like (all refer to FIG. 11), and is a plate-like or sheet-like member configured to support the liquid crystal panel 11.

The holding section 34 may be made of a material having elasticity such as rubber. The shape of the holding section 34 is not specifically limited, as long as the holding section 34 is allowed to hold the control circuit board 12; however, for example, as illustrated in FIG. 3, the holding section 34 may preferably have a shape allowing the control circuit 12 to be supported by a locking section 34a without completely fixing the control circuit board 12.

(1-2. Change in Shape of Display Unit Before Driving and During Driving)

FIG. 4 is a perspective view of a configuration of a main part of a display unit (a display unit 100A) including the above-described display panel curved in an arc shape and a flat plate-like control circuit board. In the display unit 100A, since a control circuit board 120 is flat, nonuniform deflection occurs in a flexible printed circuit board 130 configured to connect the display panel 110 and the control circuit board 120 to each other. More specifically, for example, when the control circuit board 120 is connected to the curved display panel 110 with use of two COFs 130, as illustrated in FIG. 4, one side of each of the COFs 130, for example, one side on a side closer to each end of the liquid crystal panel 110 of each of the COFs 130 is in a state without play. On the other hand, the other side on a side closer to a central portion of the liquid crystal panel 110 of each of the COFs 130 is in a sagged state with play. Thus, nonuniform deflection occurs in the COFs 130, and stress is applied to the COFs 130 and IC chips 130A provided on the COFs 130 to cause deterioration in display quality by a long period of use.

On the other hand, in the display unit 1 in this embodiment, the control circuit board 12 is curved in the same direction as the curve direction of the liquid crystal panel 11. Therefore, the liquid crystal panel 11 and the control circuit board 12 are arranged substantially in parallel to each other, and as illustrated in FIG. 1, nonuniform deflection is less likely to occur in the COF 13 connecting them to each other.

Deflection in the COF 13 is reduced by curving the control circuit board 12 in the above-described manner, and in particular, when the curvature of the control circuit board 12 is larger than 0 and equal to or smaller than the curvature of the liquid crystal panel 11, occurrence of deflection in the COF 13 is further reduced. The reason will be described below.

The control circuit board 12 may be configured of, for example, glass fiber impregnated with an epoxy resin or the like. For example, in a case where the control circuit board 12 is disposed around a side surface of the liquid crystal panel 11, the control circuit board 12 is susceptible to heat generation of a backlight provided on the side surface of the liquid crystal panel 11. As the position of the control circuit board 12, in addition to a position around the side surface of the liquid crystal panel 11, a position above the supporting member 33 is considered. However, temperature in the display unit 1 tends to increase toward the top by heat generation of components such as the backlight of the display unit and thermal convection thereof. Therefore, even in a case where the control circuit board 12 is disposed above the supporting member 33, the control circuit board 12 is more susceptible to heat than the liquid crystal panel 11. Moreover, when the display unit 1 is driven, components on the control circuit board 12 and the IC chip 13A on the COF 13 tend to generate heat, thereby increasing temperature. Further, while the liquid crystal panel 11 is allowed to dissipate heat through the display surface, the control circuit board 12 and a periphery of the COF 13 are covered with an enclosure of the display unit; therefore, heat is less likely to be dissipated.

As described above, the control circuit board 12 when the display unit 1 is driven is susceptible to heat generation of components of the display unit 1 including a circuit provided on the control circuit board 12, and is deformed more largely than the liquid crystal panel 11. Therefore, a difference in curvature between the liquid crystal panel 11 and the control circuit board 12 in a driving state of the display unit 1 is reduced by setting the curvature of the control circuit board 12 to be equal to or smaller than the curvature of the liquid crystal panel 11. In other words, generation of stress applied to the COF 13 connecting the liquid crystal panel 11 and the control circuit board 12 to each other is suppressed, and deterioration in display quality due to deterioration in characteristics of the COF 13 and the IC chip 13A provided on the COF 13, and the like is reduced.

Parts (A) and (B) in FIG. 5 schematically illustrate deformation of the display unit 1 before (the part (A) in FIG. 5) and during (the part (B) in FIG. 5) driving of the display unit 1 in which the COF 13 is bent as illustrated in FIGS. 2A to 2C and the control circuit board 12 is disposed on a back surface of the supporting section 33. More specifically, in the display unit 1 before driving, as illustrated in the part (A) in FIG. 5, a space between the liquid crystal panel 11 and the control circuit board 12 disposed on the back surface side of the liquid crystal panel 11 is narrow in a central portion, and is widened toward both ends. When the display unit 1 configured with such an arrangement is driven, as described above, the control drive board 12 is deformed more largely than the liquid crystal panel 11, and more specifically, the control drive board 12 extends to a lateral direction (the X direction) by thermal expansion. Therefore, as illustrated in the part (B) in FIG. 3, a difference in curvature between the liquid crystal panel 11 and the control circuit board 12 is reduced, and the space is substantially uniform from the central portion to both ends. In other words, occurrence of deflection in the COF 13 is suppressed.

Now, parts (A) and (B) in FIG. 6 illustrate change in shapes of a liquid crystal panel 110 and a control circuit board 120 before and during driving of a display unit 100B in which a curvature of the control circuit board 120 is larger than a curvature of the liquid crystal panel 110 as a comparative example. Respective arrangement spaces in a case where the curvature of the control circuit board 120 is larger than the curvature of the liquid crystal panel 110 are substantially parallel in a central portion and end portions of the display panel 110 as illustrated in the part (A) in FIG. 6. On the other hand, in a case where the display unit 100B is driven, a thermal expansion coefficient of the liquid crystal panel 110 is smaller than that of the control circuit board 120; therefore, extension of the liquid crystal panel 110 is smaller than that of the control circuit board 120. Therefore, as illustrated in the part (B) in FIG. 6, a difference in curvature between the liquid crystal panel 110 and the control circuit board 120 is further increased, and nonuniform deflection is more likely to occur in a COF 130. Moreover, since the curvature of the control circuit board 120 is increased, reliability of components mounted on the control circuit board 120 may be reduced.

It is to be noted that, as illustrated in the parts (A) and (B) in FIG. 5, the control circuit board 12 is deformed in a longitudinal direction (the X direction) with respect to the control circuit board 12 before and during driving of the display unit 1. Therefore, the holding section 34 configured to hold the control circuit board 12 may preferably have room to absorb deformation of the control circuit board 12. In other words, a holding width (W1) of the holding section 34 may be preferably larger than a thickness (W2) of the control circuit board 12 (refer to FIG. 7A). More specifically, the holding width (W2) of the holding section 34 may be preferably a width that does not interfere with deformation of the control circuit board 12. For example, it is only necessary to have room to an extent to which in the control circuit board 12 in the holding section 34 before driving, as illustrated in FIG. 7A, a back surface thereof in a central portion (more specifically, in holding sections 34B and 34C) is held in contact with a wall surface of the holding section 34 and as illustrated in FIG. 7B, a front surface thereof in both end portions (more specifically, in holding sections 34A and 34D) is held in contact with the locking section 34a of the holding section 34.

Moreover, as illustrated in the parts (A) and (B) in FIG. 5, since the control circuit board 12 is deformed in the longitudinal direction (the X direction) with respect to the control circuit board 12 before and after driving of the display unit 1, it is only necessary to have room to absorb deformation of the control circuit board 12 at least in both end portions (for example, in the holding sections 34A and 34D) of the control circuit board 12. Therefore, the central portion (for example, in the holding sections 34B and 34C (the parts (A) and (B) in FIG. 5)) of which deformation by thermal expansion is small of the control circuit board 12 may be fixed by screws 35A and 35B as illustrated in FIG. 8.

Moreover, a member (the supporting member 33 in this case) allowing the control circuit board 12 to be disposed thereon may preferably have a smaller thermal expansion coefficient than the control circuit board 12. This is because, in a driving state of the display unit 1 (in a state in which temperature is higher than that before driving of the display unit 1), stress may be applied to the COF 13 by excessive extension caused by an influence of the supporting member 33.

Further, the heat dissipation sheet 14 may preferably have flexibility. The heat dissipation sheet 14 is configured to dissipate heat generated by the IC chip 13A, and silicone rubber containing a filler such as ceramic is allowed to be used. For example, a Denka thermally conductive sheet (manufactured by Denki Kagaku Kogyo Kabushiki Kaisha) or the like may be used. The liquid crystal panel 11 and the control circuit board 12 having curvatures like this embodiment thermally expand and are deformed by heat generation of components such as a light source configuring the display unit during driving. Therefore, the IC chip 13A formed on the COF 13 connecting the liquid crystal panel 11 and the control circuit board 12 to each other is deformed by influences of respective curvatures. Therefore, to reliably perform heat dissipation from the IC chip 13A, a material capable of being deformed with deformation of the liquid crystal panel 11 and the control circuit board 12, i.e., a material having flexibility may be preferably used as the heat dissipation sheet 14.

Furthermore, the curvature of the heat dissipation sheet 14 may be preferably equal to or larger than 0 and equal to or smaller than the curvature of the liquid crystal panel 11 as with the control circuit board 12. In a case where the COF 13 is bent, the control circuit board 12 is disposed on the back surface of the supporting member 33. At this time, a surface opposite to a surface in contact with the IC chip 13A of the heat dissipation sheet 14 disposed on the IC chip 13A is considered to be disposed on the supporting member 33 configured to support the liquid crystal panel 11 as illustrated in FIGS. 2A and 2B. Therefore, in a case where the curvature of the heat dissipation sheet 14 is larger than the curvature of the liquid crystal panel 11, the curvature of the supporting member 33 configured to support the liquid crystal panel 11 may be preferably larger than the curvature of the liquid crystal panel 11; however, in this case, the curvatures of the liquid crystal panel 11 and the supporting member 33 are different from each other, and stress is applied to the display panel accordingly.

In addition, the thermal expansion coefficient of the liquid crystal panel 11 may be preferably smaller than that of the control circuit board 12. When the thermal expansion coefficient of the liquid crystal panel 11 is smaller than the control circuit board 12, extension of the liquid crystal panel 11 by temperature change is smaller than that of the control circuit board 12. In other words, a difference in curvature between the liquid crystal panel 11 and the control circuit board 12 in the driving state of the display unit is reduced. Moreover, the curvature of the control circuit board 12 is allowed to be reduced, thereby leading to an improvement in reliability of a component mounted on the control circuit board 12. This is because the component mounted on the control circuit board 12 is disposed in a state in which the board is flat; therefore, when the control circuit board 12 is bent, stress is applied to a connection section between the component and the control circuit board 12 to lose connection due to generation of a crack or the like. Therefore, the curvature of the control circuit board 12 may be preferably as small as possible.

(1-3. Entire Configuration of Display Unit)

FIG. 9 illustrates an appearance of the display unit 1 in this embodiment viewed from a front surface side, and FIG. 10 illustrates an appearance of the display unit viewed from a back surface side. As described above, the main body section 10 may include, for example, the liquid crystal panel 11 as a display body. Front exterior members 17 for shielding of a speaker that will be described later are mounted on right and left ends of the main body section 10. Top and bottom sides of the liquid crystal panel 11 and the front exterior members 17 are covered with decorative members (front bezels) 16. A back surface of the main body section 10 is covered with a rear exterior member (rear cover) 17.

FIG. 11 specifically illustrates an internal configuration in a central portion of the liquid crystal panel 11 illustrated in FIGS. 9 and 10, and illustrates a section parallel to the Y direction. The liquid crystal panel 11 includes the front enclosure (top chassis) 31, the liquid crystal cell 32, a middle enclosure (middle chassis) 36, the optical sheet 33A, the light guide plate 33B, and the reflector 33C in this order from the front to the rear along the Z direction. It is to be noted that a rear enclosure 40 is provided behind the reflector 36.

The front enclosure 31 is a frame-shaped metal component with which the front peripheral portion of the liquid crystal panel 11 is covered. As described above, the liquid crystal cell 32 may have, for example, a configuration in which a liquid crystal layer (not illustrated) is sealed between two substrates 32A and 32B of glass or the like. The liquid crystal cell 32 may include, for example, a source driver and a source substrate 32D. The middle enclosure 35 is a frame-shaped resin component configured to hold the liquid crystal cell 32 and the optical sheet 33A. The optical sheet 33A may include, for example, a diffuser plate, a diffuser sheet, a lens film, polarization separation sheet, or the like. The light guide plate 33B is configured to guide light from a light source (not illustrated) toward the liquid crystal panel 11, and may be configured by including mainly a transparent thermoplastic resin such as a polycarbonate resin (PC) or an acrylic resin (for example, PMMA (polymethylmethacrylate)). The reflective member 33C is configured to return, toward the light guide plate 33B, light emitted to the rear side of the light guide plate 33B, and is a plate-like or sheet-like member such as foamed PET (polyethylene terephthalate), an evaporated silver film, a multilayer reflective film, or white PET.

Each of main components (except for frame-shaped components and boards) of the liquid crystal panel 11, i.e., the liquid crystal cell 32, the optical sheet 33A, the light guide plate 33B, and the reflector 33C is configured of a thin plate-like or sheet-like flexible member made of glass or a resin. Therefore, the liquid crystal panel 11 has flexibility as a whole.

The stands 20 illustrated in FIGS. 9 and 10 may be preferably provided at the bottom right and the bottom left of the main body section 10. The reason is as follows. In a case where the liquid crystal panel 11 is curved in a convex shape rearward, positions of right and left ends of the main body section 10 are located in front of a position of a barycenter of the main body section 10; therefore, the stands 20 are hidden by the main body section 10, and compared to a case where the liquid crystal panel 11 is flat, protrusion toward the front of the main body section 10 of the stands 20 is less noticeable. Moreover, as will be described later, speakers are disposed on the right and left ends of the main body section 10; therefore, the speakers are allowed to be reliably supported by the stands 20 provided at the bottom right and the bottom left of the main body section 10.

It is to be noted that the positions of the stands 20 are not limited to the bottom right and the bottom left of the main body section 10, and the stands 20 may be provided at the bottom of a central portion of the main body section 10. Further, in a case where the curve of the liquid crystal panel 11 is strong, the main body section 10 is allowed to stand alone without the stands 20. The stand 20A and the stand 20B on the left and the right in FIG. 2, respectively, may be separated from each other or may be connected to each other.

Speakers 18 are arranged at the right and left ends of the main body section 10 (on the right and the left of the liquid crystal panel 11). An image and sound are visually integrated without separation by arranging the speakers 18 at the right and left ends of the main body section 10 in such a manner, and accordingly, a sense of unity and a sense of immersion are allowed to be further enhanced together with visual effects of perspective by the above-described curve of the liquid crystal panel 11.

The speakers 18 may preferably protrude from the right and the left of the liquid crystal panel 11 to a rear of the rear enclosure 40. Thus, the capacities of the speakers 18 are secured to allow an increase in output and an improvement in sound quality. It is to be noted that an external surface of the rear exterior member 17 may have a curved shape as with the liquid crystal panel 11; however, for example, as illustrated in FIG. 9, the external surface of the rear exterior member 17 may preferably be a flat surface. Accordingly, a wide space is formed between the rear enclosure 40 and the rear exterior member 17, and the capacities of the speakers 18 are allowed to be increased by arranging the speakers 18 around the space.

The control circuit board 12 including a source substrate, the timing controller substrate, the balancer substrate configured to control a backlight light source, and the like is mounted in the rear enclosure 40.

As described above, in a case of a typical flat panel type display unit not having a curved surface, an electrode terminal section for external connection of a display device and a drive circuit board are arranged in parallel to each other. Therefore, in a case where deflection occurs in the flexible printed circuit board, uniform deflection typically occurs. However, as illustrated in FIG. 4, in a case of the display unit 100A in which the display panel 110 has a curvature, an electrode terminal section for external connection (the display panel 110) of a display device and the drive circuit board 120 are not arranged in parallel to each other. More specifically, while the display panel 110 has a curvature, the drive circuit board 120 does not have a curvature. Therefore, nonuniform deflection occurs in the flexible printed circuit board 130. In other words, stress is more likely to be applied to the flexible printed circuit board 130 and the like, and there is a possibility that display quality is deteriorated by a long period of use. To solve this issue, in the above-described PTL 1, there is proposed a method of reducing stress by providing a slit having a small circular hole to a flexible printed circuit board, and appropriately adjusting a slit width of the slit. However, the flexible printed circuit board having such a small circular hole has issues of little versatility and an increase in cost; therefore, the flexible printed circuit board is not widely used.

On the other hand, in the display unit 1 in this embodiment, the curvature of the control circuit board 12 connected to the liquid crystal panel 11 through the COF 13 is larger than 0 and equal to or smaller than the curvature of the display device. Therefore, the liquid crystal panel 11 (more specifically, the electrode terminal section for external connection) and the drive circuit board 12 are arranged nearly parallel to each other, nonuniform deflection is less likely to occur in the COF 13, and generation of stress applied to the COF 13 is suppressed.

As described above, in this embodiment, the curvature of the control circuit board 12 of the liquid crystal panel 11 and the control circuit board 12 connected to each other through the COF 13 is larger than 0 and equal to or smaller than the curvature of the liquid crystal panel 11. Therefore, generation of stress caused by nonuniform deflection in the COF 13 is suppressed, and deterioration in display quality with time by a long period of use is allowed to be suppressed.

Next, Modification Examples 1 and 2 of the display unit 1 in this embodiment will be described below. It is to be noted that like components are denoted by like numerals as of the above-described embodiment and will not be further described.

Modification Example 1

FIG. 12 illustrates a configuration of a main part of a display unit 2 according to Modification Example 1 viewed from directly above. This display unit 2 differs from the above-described display unit 1 in that the control circuit board 12 is partitioned (into two along the X direction in this case).

In a case where the display unit 2 is large, the control circuit board 12 extends in a curve direction (the X direction in this case). When the control circuit board 12 is too long, in the driving state of the display unit (a state in which temperature is higher than that before driving of the display unit), the control circuit board 12 extends largely, thereby applying stress to the COF 13; therefore, this is not preferable. In such a case, the control circuit board 12 is partitioned into a plurality of portions as with this Modification Example 1 to reduce a length in an extending direction of one control circuit board 12. It is to be noted that the length of the control circuit board 12 largely differs depending on temperature in the driving state of the display unit, but may be preferably, for example, less than about 50 cm. It is to be noted that the control circuit board 12 may be preferably held by the holding section 34 made of rubber as with the above-described embodiment; however, in a case where the length of the control circuit board 12 is short (in a case where the control circuit board 12 is partitioned as with this modification example, or in a case where the display unit is small), as illustrated in FIG. 12, the control circuit board 12 may be fixed by a screw.

Fluctuation is reduced with respect to external vibration by partitioning the control circuit board 12 to reduce the length thereof in the curve direction as with this Modification Example 1. Therefore, movement of the COF 13 is reduced, and stress applied to the COF 13 is reduced. Moreover, in the driving state of the display unit 2 (in a state in which temperature is higher than that before driving of the display unit), the expansion (extension) coefficient of the control circuit board 12 is reduced. Therefore, stress applied to the COF 13 is allowed to be further reduced.

Modification Example 2

FIG. 13 illustrates a configuration of a main part of a display unit 3 according to Modification Example 2, and FIG. 14 illustrates a sectional configuration of the main part of the display unit 3 illustrated in FIG. 13 together with other components. In the display unit 3 according to this Modification Example 1, the COF 13 may not be bent, and the control circuit board 12 may be disposed on a same plane as the liquid crystal panel 11 or on a plane equivalent to the plane (nearly on a plane). Thus, the COF 13 is less likely to be bent by such a flat arrangement, and stress on the COF 13 and the IC chip 13A is allowed to be further reduced. Moreover, the length of the COF 13 is allowed to be reduced.

Although the present disclosure is described referring to the embodiment and Modification Examples 1 and 2, the present disclosure is not limited thereto, and may be variously modified. For example, a shape configured by combining the above-described embodiment and the above-described modification examples as appropriate may be adopted.

Moreover, in the above-described embodiment, in the above-described embodiment and the like, the liquid crystal display unit is described as an example of the display body; however, the present disclosure is not limited thereto, and an organic EL display unit may be used.

Further, for example, the material, the thickness, and the like of each layer are not limited to those described in the above-described embodiment and the like, and other materials and thicknesses may be adopted. For example, the liquid crystal panel 11 may be configured of a glass substrate or may use a plastic substrate.

Furthermore, for example, the configurations of the display units 1 to 3 (televisions) are specifically described in the above-described embodiment and the like; however, all of the components may not be necessarily included, and other components may be further included.

The present disclosure is applicable to, in addition to the television described in the above-described embodiment, electronic apparatuses, such as monitors of PCs (Personal Computers) and public displays, configured to display, as an image or a picture, an image signal input from an external device or an image signal produced inside.

It is to be noted that the present technology is allowed to have following configurations.

(1) A display unit including:
a first plate-like member including a display device;
a second plate-like member including a drive circuit, the drive circuit configured to control the display device; and
one or two or more wiring sections having flexibility, the wiring sections configured to connect the first plate-like member and the second plate-like member to each other,
in which a curvature of the second plate-like member is larger than 0 and equal to or smaller than a curvature of the first plate-like member.

(2) The display unit according to (1), in which a thermal expansion coefficient of the first plate-like member is smaller than that of the second plate-like member.

(3) The display unit according to (1) or (2), in which the second plate-like member is disposed on a same plane as the first plate-like member.

(4) The display unit according to any one of (1) to (3), in which the second plate-like member is disposed on a back surface side of the first plate-like member.

(5) The display unit according to any one of (1) to (4), in which the wiring section includes two parallel sections with respect to the first plate-like member and a vertical section connecting these parallel sections to each other.

(6) The display unit according to any one of (1) to (5), in which the second plate-like member is not fixed.

(7) The display unit according to any one of (1) to (5), in which at least a part of the second plate-like member is fixed to a member with a thermal expansion coefficient equal to or smaller than that of the second plate-like member.

(8) The display unit according to any one of (1) to (7), in which an IC chip is provided on the wiring section.

(9) The display unit according to (8), in which the IC chip is in contact with a heat dissipation member.

(10) The display unit according to any one of (1) to (9), in which respective IC chips provided to the respective two or more wiring sections are connected to one another by a heat dissipation member.

(11) The display unit according to (10), in which a curvature of the heat dissipation member is equal to or larger than 0 and equal to or smaller than that of the first plate-like member.

(12) The display unit according to any one of (5) to (10), in which an IC chip is disposed in the parallel section of the wiring section.

(13) The display unit according to any one of (5) to (10), in which an IC chip is disposed in the vertical section of the wiring section.

The present disclosure contains subject matter related to that disclosed in Japanese Priority Patent Application No. 2012-147761 filed in the Japan Patent Office on Jun. 29, 2012, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A display unit comprising:
a first plate-like member including a display device;
a second plate-like member including a drive circuit, the drive circuit configured to control the display device; and
two or more wiring sections having flexibility, each of the wiring sections coupling the first plate-like member and the second plate-like member to each other,
wherein a curvature of the first plate-like member is larger than 0 and the curvature of the first plate-like member is larger than a curvature of the second plate-like member,
wherein both the first plate-like member and the second plate-like member are curved in the same direction.

2. The display unit according to claim 1, wherein a thermal expansion coefficient of the first plate-like member is smaller than that of the second plate-like member.

3. The display unit according to claim 1, wherein the two or more wiring sections each include two parallel sections with respect to the first plate-like member and a vertical section connecting these parallel sections to each other.

4. The display unit according to claim 1, wherein an IC chip is provided on each of the wiring sections.

5. The display unit according to claim 1, wherein second plate-like member is flat prior to attachment to the first plate-like member.

6. The display unit according to claim 1, further comprising at least one holding section attached to a supporting member, which is attached to one side of the first plate-like member, wherein the at least one holding section comprises a locking section at both ends of the holding section for supporting the second plate-like member.

7. The display unit according to claim 3, wherein the second plate-like member is disposed on a back surface side of the first plate-like member.

8. The display unit according to claim 3, wherein the width of the interior gap of the at least one locking section (W1) is larger than a thickness of the second plate-like member.

9. The display unit according to claim 3, wherein an IC chip is provided on each of the wiring sections.

10. The display unit according to claim 9, wherein the IC chip on each of the wiring sections is in contact with a heat dissipation member.

11. The display unit according to claim 10, wherein a curvature of the heat dissipation member is equal to or larger than 0 and equal to or smaller than that of the first plate-like member.

12. A display unit comprising:
a first plate-like member including a display device;
a second plate-like member including a drive circuit, the drive circuit configured to control the display device; and
two or more wiring sections, each of the wiring sections connecting the first plate-like member and the second plate-like member to each other,
wherein a curvature of the first plate-like member is larger than 0 and the curvature of the first plate-like member is larger than a curvature of the second plate-like member,
wherein both the first plate-like member and the second plate-like member are curved in the same direction.

13. The display unit according to claim 12, wherein a thermal expansion coefficient of the first plate-like member is smaller than that of the second plate-like member.

14. The display unit according to claim 12, further comprising at least one holding section attached to a supporting member, which is attached to one side of the first plate-like member, wherein the at least one holding section comprises a locking section at both sides of the holding section for supporting the second plate-like member.

15. The display unit according to claim 14, wherein second plate-like member is flat prior to attachment to the first plate-like member.

16. The display unit according to claim 12, wherein second plate-like member is flat prior to attachment to the first plate-like member.

17. The display unit according to claim 16, wherein an IC chip is provided on each of the wiring sections.

* * * * *